US006751841B2

(12) United States Patent
Schnabel et al.

(10) Patent No.: US 6,751,841 B2
(45) Date of Patent: Jun. 22, 2004

(54) RIVETING METHOD (75) Inventors: John David Schnabel, Fareham (GB); Stephen David Sparkes, Farnborough (GB)

(73) Assignee: Sun Microsystems, Inc., Santa Clara, CA (US)

( * ) Notice: Subject to any disclaimer, the term of this patent is extended or adjusted under 35 U.S.C. 154(b) by 80 days.

(21) Appl. No.: 10/166,524

(22) Filed: Jun. 10, 2002

(65) Prior Publication Data

US 2003/0226249 A1 Dec. 11, 2003

(51) Int. Cl.[7] ............................................... B21D 39/00
(52) U.S. Cl. .................................. 29/524.1; 29/525.06
(58) Field of Search .............................. 29/512, 525.06, 29/524.1, 523, 243.53, 243.521; 72/391.4; 411/501; 403/274

(56) References Cited

U.S. PATENT DOCUMENTS

| | | | | |
|---|---|---|---|---|
| 2,371,452 A | * | 3/1945 | Lees, Jr. ........................ | 29/523 |
| 3,047,181 A | * | 7/1962 | Heidenwolf ................... | 29/523 |
| 3,460,429 A | * | 8/1969 | La Torre ..................... | 29/524.1 |
| 4,048,708 A | * | 9/1977 | Briles ......................... | 29/524.1 |
| 4,221,041 A | * | 9/1980 | Hufnagl et al. ............. | 29/524.1 |
| 5,120,175 A | * | 6/1992 | Arbegast et al. ........... | 29/524.1 |
| 5,651,172 A | * | 7/1997 | Auriol et al. ............... | 29/524.1 |
| 5,697,141 A | * | 12/1997 | Denham et al. .......... | 29/525.06 |
| 5,741,099 A | * | 4/1998 | Aasgaard .................. | 29/525.06 |

* cited by examiner

*Primary Examiner*—David P. Bryant
(74) *Attorney, Agent, or Firm*—Meyertons Hood Kivlin Kowert & Goetzel, P.C.; B. Noël Kivlin (57) ABSTRACT

A method of joining a plurality of sheets by means of a blind rivet, comprises:

(i) forming holes in the sheets and placing the sheets together so that the holes are in register and form a single hole therethrough;

(ii) inserting a blind rivet into the hole formed in the sheets from a working side thereof, the blind rivet comprising a sleeve (1) positioned about a mandrel that has a head (4); and (iii) setting the rivet.

The hole (24) is radially enlarged at the outwardly facing surface of at least the sheet on the blind side, and the sleeve of the rivet is deformed during setting to form a rivet joint in which no part of the rivet is proud of the outwardly facing surface (28) of the sheet at least on the blind side of the sheets. The method enables rivet joints to be formed in sheets, for example used in enclosures that house modules, where there is no space available for the set rivets to protrude.

11 Claims, 6 Drawing Sheets

RIVETING METHOD

BACKGROUND OF THE INVENTION

The present invention relates to methods of forming rivet joints.

Rivets and methods of joining metal sheets together employing rivets have been known for many years, and involve inserting a rivet into aligned holes drilled through the sheets followed by deforming the rivet by compression so that it expands radially on either side of the sheets and holds them together. Where access to only one side of the sheets is easily available, it is usual to employ a blind rivet for forming the joint. A typical blind rivet comprises a sleeve formed from the rivet material that is located about a mandrel having an enlarged head at one end. Usually the mandrel extends some distance beyond the other end of the rivet sleeve as a pulling stem, and a radially extending flange is provided on the end of the rivet sleeve opposite to the mandrel head. In addition, a point of weakness called a breakneck may be provided in the mandrel in the region of the rivet sleeve. The blind rivet can be inserted through the hole formed in the sheets to be joined beginning with the head of the mandrel until the flange on the rivet sleeve abuts the surface of the sheet on the working side thereof so that only the head of the mandrel and part of the rivet sleeve are located on the blind side of the sheets. The rivet can then be set by means of a rivet setting tool which grasps the pulling stem of the rivet and pulls it away from the proximal end of the rivet sleeve while applying a reaction force to the flanged end of the sleeve. This causes the head of the mandrel to be drawn toward the sleeve and the sleeve to be compressed between the head of the mandrel and the rivet setting tool. The setting tool will apply a sufficient force to deform the rivet sleeve axially, and therefore radially, so that the set rivet will hold the sheets together. After setting of the rivet, the mandrel may be snapped in two at the breakneck and the remainder of the pulling stem can be discarded. The head of the mandrel and any part adjacent to it may be removed and discarded so that only the deformed rivet sleeve remains, although in some circumstances it may be left in the sleeve. Thus, in order to grip the sheets and hold them together, some volume of rivet sleeve material is required to remain on each outwardly directed surface of the metal sheets, this being provided by the flange on one side of the sheets.

This form of riveting has been considered for joining parts of the chassis or housing of an electronics assembly. Such a chassis or housing that has been employed is in the form of a container formed from sheet metal such as pressed aluminium zinc plated steel and having a number of internal, generally rectangular areas for receiving various components, for instances power modules, printed circuit boards, disc, tape and CD-ROM drives etc. Space is normally at a premium in such assemblies and various components will usually be inserted by sliding rectangular modules into the appropriate recesses with no more than one or two millimetres of tolerance. It is not economically feasible to join the various sheets forming the internal and external walls of the housing by spot welding because this would require re-plating of the steel sheets after welding. Also, it is not possible to employ usual rivets in such an assembly because this would require access to both sides of the sheets to be joined by a relatively large "I" shaped anvil of a setting tool.

Accordingly it has been considered to employ blind rivets for joining the various metal sheets forming the chassis of the equipment. However the formation of protuberances on both surfaces of the sheets to be joined by the rivets is not compatible with the requirement to be able to slide the various components into and out of the chassis, nor is it compatible with the proximity of various joined metal sheets forming internal partitions or bulkheads to other parts of the chassis.

SUMMARY OF THE INVENTION

According to one aspect, the present invention provides a method of joining a plurality of sheets by means of a blind rivet, which comprises:

(i) forming holes in the sheets and placing the sheets together so that the holes are in register and form a single hole therethrough;

(ii) inserting a blind rivet into the hole formed in the sheets from a working side thereof, the blind rivet comprising a sleeve positioned about a mandrel that has a head; and (iii) setting the rivet;

wherein the hole is radially enlarged at the outwardly facing surface of at least the sheet on the blind side, and the sleeve of the rivet is deformed during setting to form a rivet joint in which no part of the rivet is proud of the outwardly facing surface of the sheets at least on the blind side of the sheets.

Thus, the method according to the invention has the advantage that access is only necessary to one side of the metal sheets to be joined (the working side) but that it is possible to form a rivet joint that does not protrude on the other surface of the sheets that are joined (the blind side).

It is possible for the hole to be radially enlarged at the outwardly facing surfaces of both sheets and, after setting of the rivet, for no part of the rivet to be proud of the outwardly facing surface of either sheet.

The rivet sleeve may be shaped to engage the radial enlargement on the working side of the hole, so that it performs a similar function to the flange on the sleeve of conventional blind rivets but does not extend beyond the plane of the outwardly facing surface on the working side. This may be achieved by forming the sleeve with an enlarged part, for example a part that tapers outwards in the form of a conical frustum (referred to herein as "frusto-conical") and which engages the radial enlargement in the hole when the rivet is inserted into the hole.

Such a form of rivet is novel per se, and so, according to another aspect, the invention provides a blind rivet which comprises a hollow sleeve having an internal bore, and a mandrel that extends through the bore of the sleeve and has a head for supplying force to the sleeve during setting of the rivet, wherein the sleeve has a substantially frusto-conical portion at its end opposite to the head of the mandrel that tapers radially outwards in a direction away from the head of the mandrel.

The radial enlargement on either side of the sheets may have any appropriate shape and need not necessarily be frusto-conical: it could, for example, be a generally cylindrical counterbore of larger diameter than the hole so that the rivet sleeve would have one part of smaller diameter that could extend through the hole and a second cylindrical part of larger diameter. The invention will be described hereafter with reference to countersinking but it should be appreciated that counterbores or other enlargements may be employed.

Whatever the shape of the part of the rivet sleeve that engages the countersink in the hole, the end surface of the rivet sleeve directed away from the mandrel head is preferably flat so that, when the rivet is inserted into the hole, the end of the sleeve on the working side is substantially flush with the surface of the sheet. It is possible if desired, and especially if manufacturing tolerances require, for the part of the rivet sleeve that engages the countersink to be slightly shorter than the depth of the countersink so that the rivet forms a slight depression in the joined metal sheets.

In an alternative form of rivet, the rivet sleeve may be substantially cylindrical, and will stand proud of the surface of the sheet on the working side when the rivet is inserted into the hole, and is deformed axially and radially into the countersink during setting of the rivet. When the rivet sleeve has such a configuration, it should be appreciated that the sleeve itself has no means of ensuring correct axial location within the hole, and so this must be provided by the setting tool. In addition, the setting tool should have a jaw that bears on the rivet sleeve itself and applies force on the rivet sleeve along the axis of the mandrel to deform the sleeve into the countersink.

The head of the mandrel may have any of a number of forms. In one form the mandrel may have a region at the base of the head that slopes with respect to the axis of the mandrel. In other words the head may be joined to the rest of the mandrel by a frusto-conical portion. With this configuration, when the rivet is set the head of the mandrel applies a radially outward force on the sleeve in addition to an axial force and thereby causes the sleeve to expand radially into the countersink on the blind side of the metal sheets. The shape of the mandrel head in this case will depend on whether or not the mandrel is discarded after setting the rivet. For example, the mandrel head may have a generally flat end surface so that it can be flush with the surface of the sheet on the blind side, in which case it may remain in the rivet after setting if desired or it can be removed.

Alternatively, the mandrel head may have a generally radially extending shoulder portion or shoulder where the head meets the shank of the mandrel so that the rivet sleeve is caused to deform axially during setting of the rivet. Such a mandrel will necessarily have a domed head which, although could be flush with the surface of the sheets on the blind side, will normally remain proud of the surface and so should be removed after setting of the rivet.

According to a further aspect, the invention provides a rivet joint that is formed between a plurality of sheets that have been placed together and have a hole extending therethrough, wherein the hole is radially enlarged at the outwardly directed surface of the at least one sheet and the rivet joint is formed by means of a rivet sleeve that extends into the or each radial enlargement but does not protrude above the outwardly directed surfaces of the sheet at the radial enlargement of the hole.

BRIEF DESCRIPTION OF THE DRAWINGS

Embodiments of the present invention will now be described in detail with reference to the accompanying drawings, in which corresponding parts are given like reference numbers. In the drawings.

DESCRIPTION OF PARTICULAR EMBODIMENTS

Figures 1, 2:
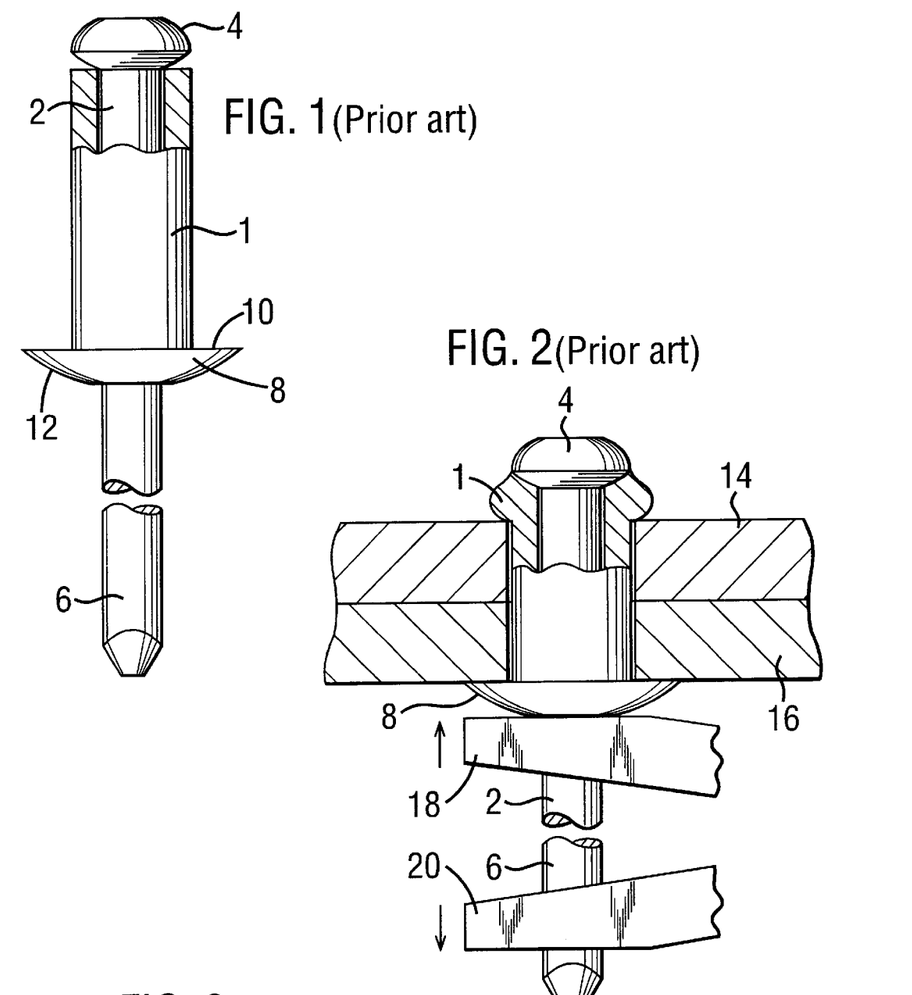
FIG. 1 is a sectional elevation of a conventional blind rivet.
FIG. 2 is a sectional elevation of the conventional rivet during setting thereof.

Referring now to the drawings, in which like reference numerals are used to designate corresponding elements, FIG. 1 shows a conventional form of blind rivet. The rivet comprises a hollow sleeve 1 having a throughbore for receiving a mandrel 2 that extends through it and terminates at one end in a head 4. At its other end the mandrel extends beyond the end of the sleeve 2 and becomes a pulling stem 6 that can be gripped by a rivet setting tool. At the end opposite the mandrel head 4, the sleeve 1 has a radially extending flange 8 having a flat inwardly facing surface 10 and a slightly domed outwardly facing surface 12.

Figure 3:
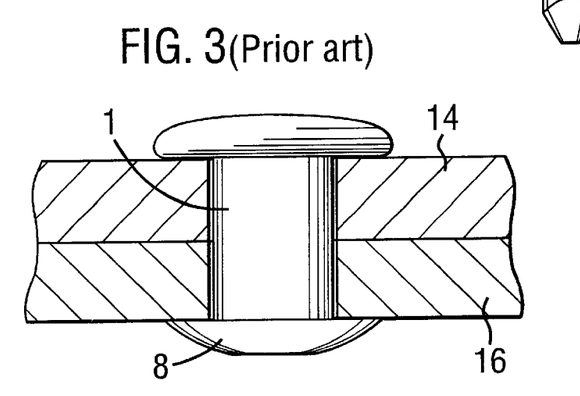
FIG. 3 is a sectional elevation of the conventional rivet after setting thereof.

In operation, in order to form a rivet joint between metal sheets 14 and 16, the rivet is inserted into a hole that has been drilled through the sheets starting with the head 4 of the mandrel until the surface 10 of the flange 8 abuts the outwardly facing surface of the sheet 16. The rivet is then set by means of a setting tool having a pair of jaws 18 and 20. One of the jaws, jaw 20, grips the pulling stem 6 while the other jaw abuts the outwardly facing surface 12 of the flange. As the setting tool is operated, the jaws 18 and 20 move apart as shown by the arrows in FIG. 2, which causes the rivet sleeve to be axially compressed between the head 4 of the mandrel and the flange 12 on the sleeve and also to expand radially. After setting of the rivet, the pulling stem can be snapped off the rest of the mandrel at a point of weakness (not shown) also called a breakneck, and both parts of the mandrel can be discarded to leave a rivet connection as shown in FIG. 3.

The standard rivet has the drawback that the rivet joint so formed has a protuberance on each side, one protuberance being formed by the flange 8 of the rivet sleeve and the other being formed by the deformed opposite end of the rivet sleeve.

Figure 4:
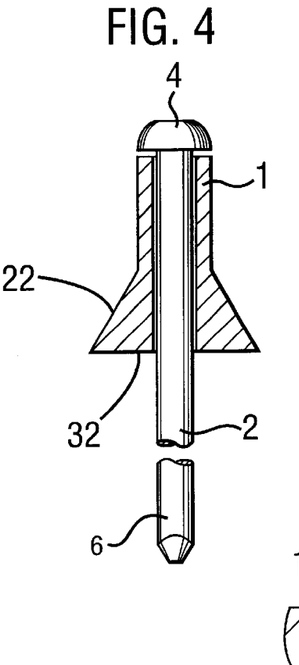
FIG. 4 is a sectional elevation of a blind rivet used in the method according to the present invention.
Figure 5:
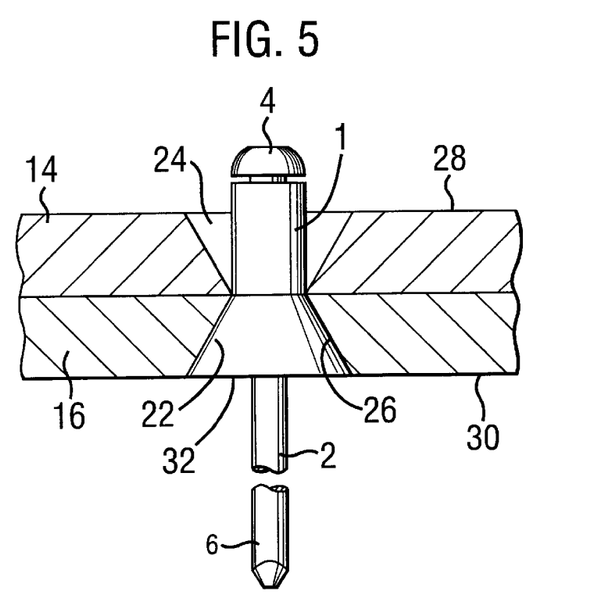
FIG. 5 is a sectional elevation of the rivet of FIG. 4 inserted in place in a workpiece.
Figure 6:
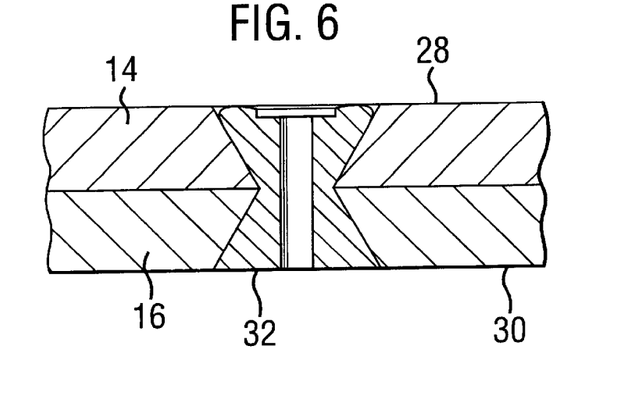
FIG. 6 is a section through a set rivet joint formed by the rivet of FIG. 4.

One method of forming a rivet joint according to the present invention in which a joint that is flush with the outer surfaces of the joined sheets is shown in FIGS. 4 to 6. A blind rivet that can be used in the method has a conventional mandrel 2 with a head at one end and forming a pulling stem at the other end. The rivet sleeve 1 has a generally cylindrical part at one end adjacent to the mandrel head 4 of an outer diameter generally equal to that of the mandrel head. At the other end, the sleeve has a frusto-conical part 22 that extends axially over approximately half the length of the sleeve and which tapers radially outwards in a direction away from the head of the mandrel.

In order to form a rivet joint a hole is formed in each sheet to be joined, but instead of a hole having a constant bore, the holes are countersunk so that each sheet 14 and 16 has a countersink 24 and 26 that is frusto-conical in shape, expanding radially toward the outwardly oriented surface 28 and 30 of each sheet. The angle of the countersink surfaces is about 120° to an axis normal to the plane of the sheets and the hole diameter increases along each countersink from 3.3 mm to 6.3 mm. The frusto-conical part 22 of the rivet sleeve has approximately the same dimensions as the countersink in sheet 30 so that the rivet can be inserted into the hole formed in the sheets from the working side and the frusto-conical part 22 of the sleeve will seat itself in the countersink 26 with outwardly directed surface 32 flush with the surface 30 of sheet 16 as shown in FIG. 5. The rivet can then be set in the same manner as with a conventional rivet so that the cylindrical end of the sleeve 1 is axially squashed by the mandrel head and is deformed radially outwardly into the countersink 24 on the blind side of sheet 14. After setting the rivet, the mandrel 2 may be snapped at its breakneck and the parts thereof removed to produce a rivet joint as shown in FIG. 6. If the size of the cylindrical part of the rivet sleeve 1 is appropriately chosen i.e. so that its volume is less than the volume of the countersink 24 in sheet 14 (after subtracting the volume of that part of the mandrel 2 that passes through the countersink 24 from the volume of the countersink) and for example not more than 80% thereof, it is possible to form a rivet joint in which no part of the rivet protrudes above the outwardly oriented surfaces 28 and 30 of the sheets.

Figure 7:
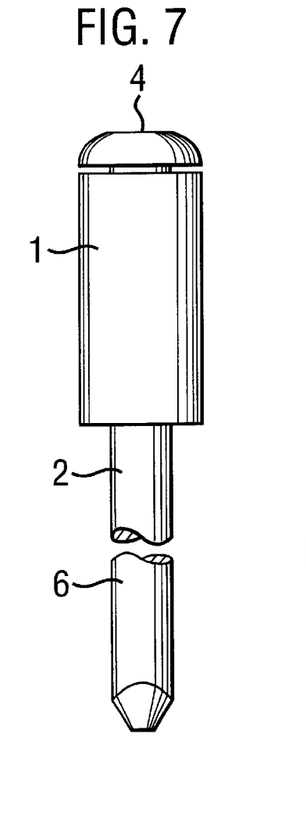
FIG. 7 is a sectional elevation of an alternative form of rivet used in the method according to the invention.
Figure 8:
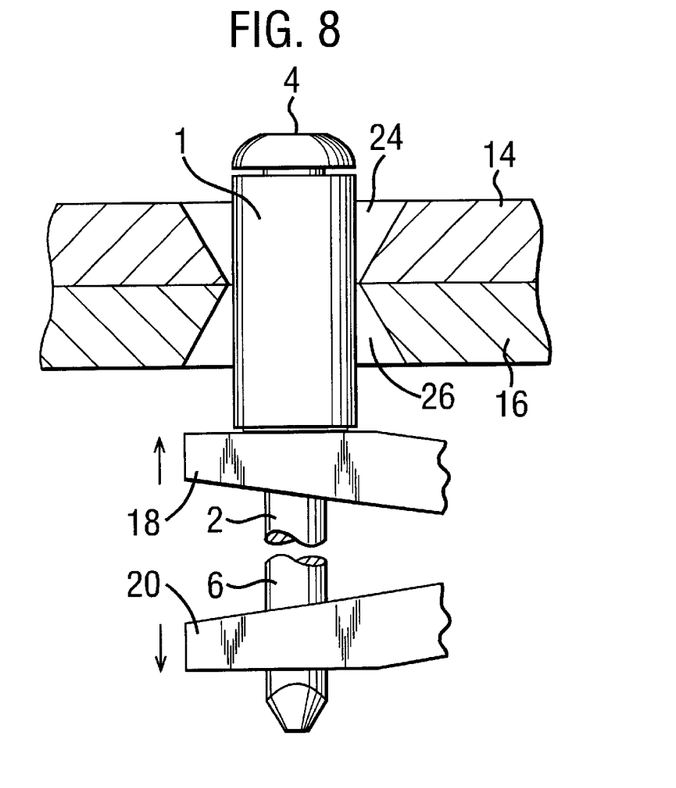
FIG. 8 is a sectional elevation of the rivet of FIG. 7 during setting.
Figure 9:
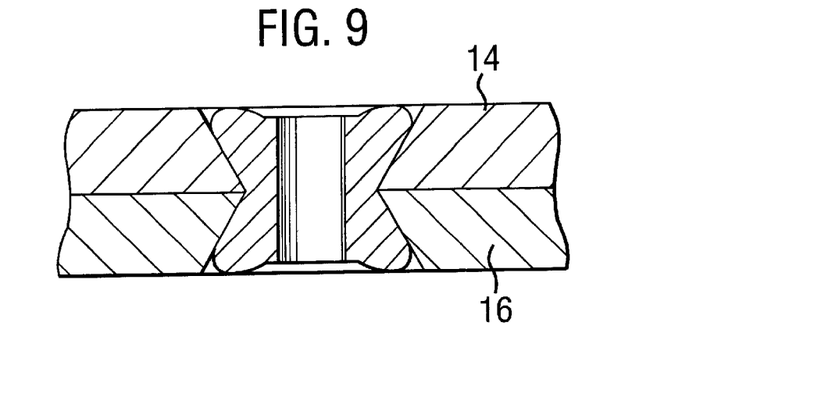
FIG. 9 is a section through the set rivet joint formed by the rivet of FIG. 4.

An alternative riveting method is shown in FIGS. 7 to 9. In this method a rivet similar to a conventional rivet is used but without a flange 8 on the rivet sleeve. In order to form a rivet joint, the rivet is inserted into a hole formed in the sheets 14 and 16 that have outwardly facing countersinks as described above, and the rivet is set as before by means of a rivet setting tool as shown in FIG. 8 so that the sleeve 1 is axially deformed under a compressive force between the head 4 of the mandrel and the jaw 18 of the rivet setting tool. In this method, both ends of the rivet sleeve are caused to deform axially and expand radially to form a rivet joint as shown in FIG. 9 after the mandrel 2 has been broken and removed. In this method, however, no element on the rivet sleeve 1 can ensure correct seating of the rivet sleeve in the countersink 26 and so another arrangement, for example provided on the setting tool, must be provided in order to ensure correct location of the rivet sleeve 1 within the hole.

As in the form of rivet shown in FIGS. 4 to 6, if the size of rivet sleeve is chosen so that the volume thereof extending within and beyond each countersink 24 and 26 is less than the volume of the countersink after subtracting the volume of that part of the mandrel that passes through each countersink from the volume of the countersink, for example not more than 80% thereof, a flush rivet joint may be obtained.

Figure 10:
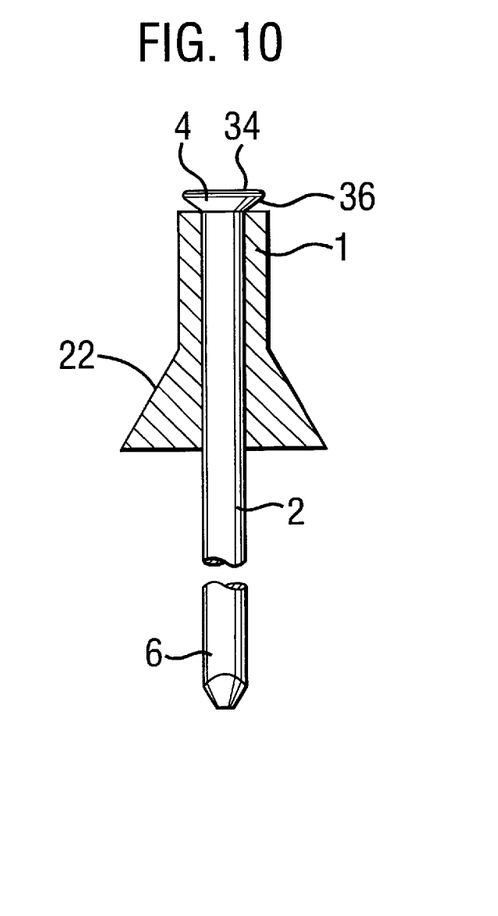
FIG. 10 is a sectional elevation of another alternative form of rivet used in the method according to the invention.
Figure 11:
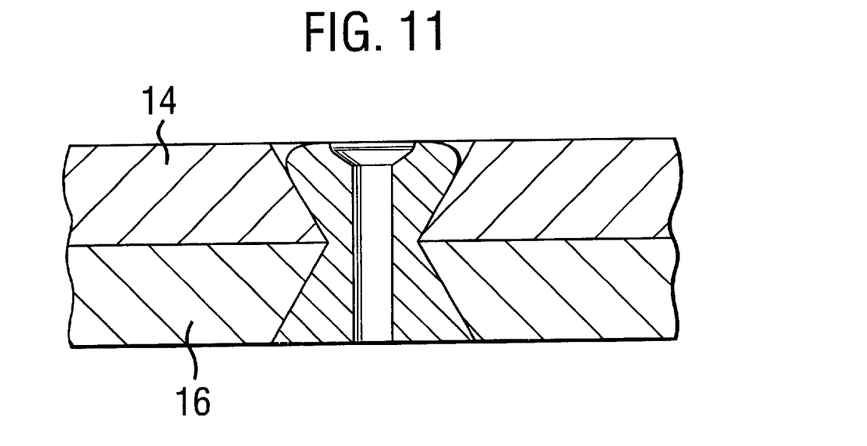
FIG. 11 is a section through a set rivet joint using the rivet of FIG. 10.

Another alternative method of forming a rivet joint according to the invention is shown in FIGS. 10 and 11. The rivet that is employed in this method is generally similar to the rivet shown in FIG. 4, and comprises a hollow rivet sleeve 1 through which a mandrel 2 extends with a head 4 at the end and forming a pulling stem at the other. The end of the sleeve 1 opposite to the mandrel head 4 has a frusto-conical form 22 in which its radius increases in a direction away from the mandrel head 4.

In this design of rivet, the mandrel head 4 has a relatively flat upper surface 34 and a frusto-conical part 36 that joins the flat upper surface of the shank of the mandrel 2.

When the rivet is set, by pulling the pulling stem 6 of the mandrel, the frusto-conical part 36 of the head will deform the upper part of the sleeve 1 radially outwardly into the countersink 24 as it enters the bore of the sleeve 1. After setting, the mandrel 2 may be broken by snapping it at a breakneck and the pulling stem discarded. The head of the mandrel may also be discarded to leave a rivet joint as shown in FIG. 11, or, because the head 4 has a flat upper surface, it may be possible to leave the mandrel head in place without it being proud of the outwardly oriented surface 28 of sheet 14.

As shown in the Figures, the countersinks in the sheets 14 and 16 extend through substantially the entire thickness of the sheets. This is not, however, necessary and the sheets may, for example, be provided with cylindrical holes that are counterbored only over part of their depth.

Figure 12A:
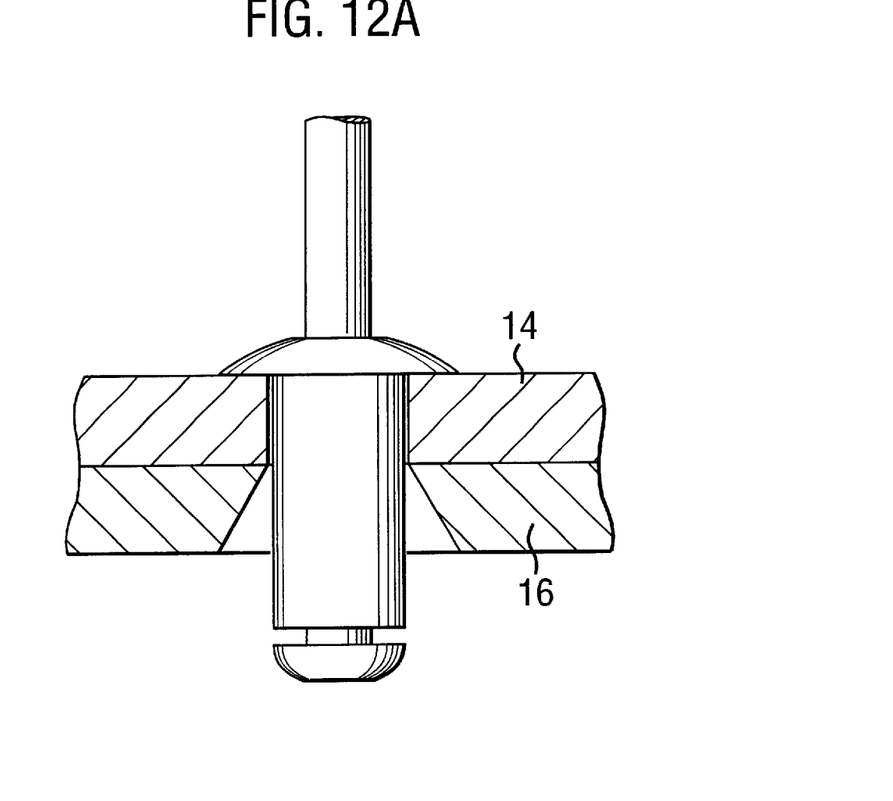
FIG. 12A and FIG. 12b are sections through yet another form of rivet joint according to the invention before and after setting.
Figure 12B:
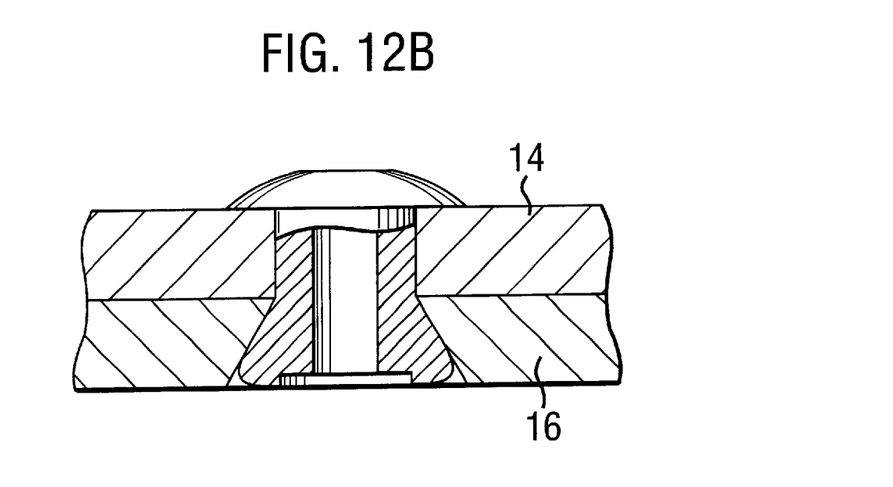

FIGS. 12A and 12B show a further form of rivet joint that may be formed by the method according to the present invention. In this method a rivet similar to a conventional rivet is employed having a rivet sleeve 1 with a flange 8, and a mandrel 2 ending in a pulling stem 6. The hole drilled through the sheet 16 on the working side is cylindrical while the hole formed in the sheet on the blind side is provided with a countersink 24. The rivet joint is formed by passing the blind rivet through the hole in the sheets 14 and 16 until the flange 8 abuts the surface of sheet 16 on the working side, and then the rivet is set by pulling the pulling stem away from the flange 8 and then breaking the mandrel head off the mandrel. When the rivet is set, the rivet will be proud of the surface of sheet 16 on the working side, but will not protrude above the outwardly facing surface 28 of the sheet 14 on the blind side. This method is useful where space on the working side of the rivet permits some degree of height but no height of the rivet can be tolerated on the blind side thereof.

Figure 13:
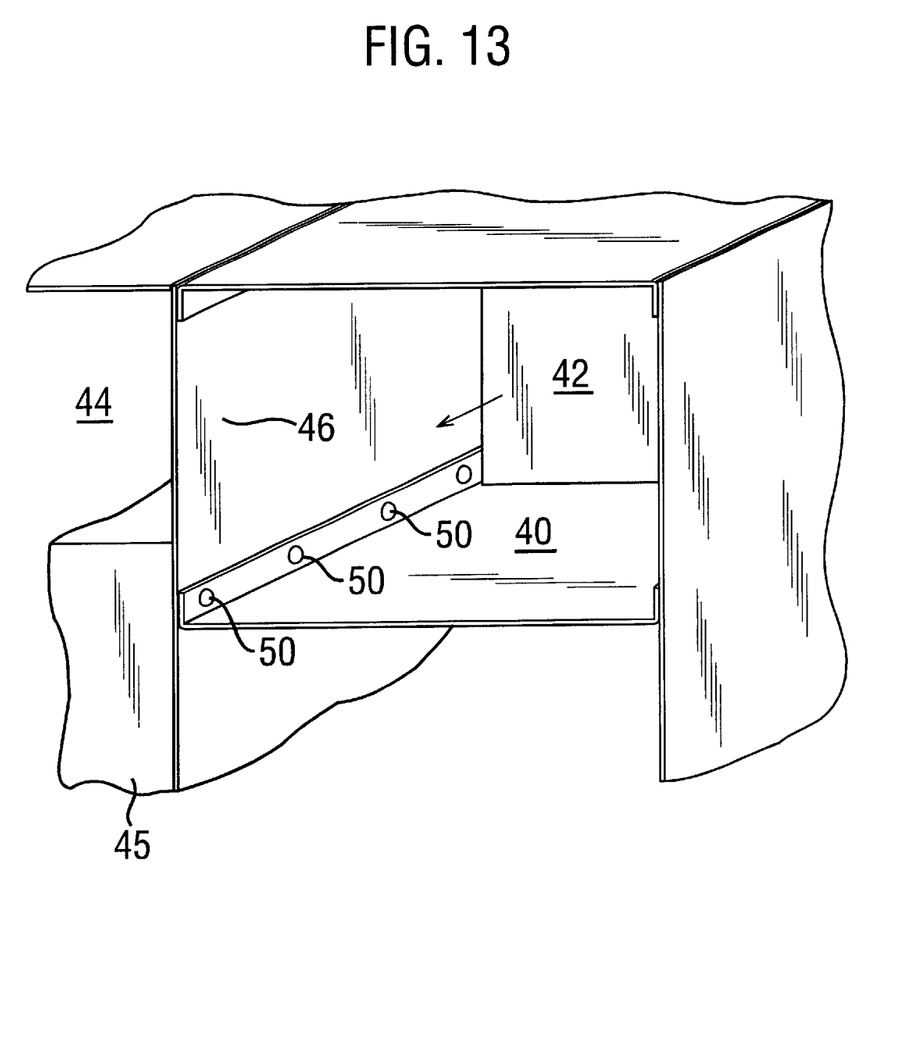
FIG. 13 is a perspective view showing part of an electronics chassis employing such rivet joints.

FIG. 13 shows part of the chassis for electronics equipment in which rivet joints formed in accordance with the present invention may be employed. The chassis has one part 40, for example, that contains a number of modules 42 that are inserted therein and slid to its correct position, in the direction of the arrow, and another part 44 that can contain other modules 45 and is separated therefrom by a partition or bulkhead 46. As shown, one partition has a flange 48 that is butted up to the bulkhead 46 and is joined thereto according to the present invention by means of flush rivets 50. In this form of assembly it is important that the rivets 50 do not protrude into space 40 or they would obstruct insertion of modules 42 therein, while no space exists between the sheet forming the partition 46 and the module 45 for a proud rivet. In addition, due to the depth of the parts 40 that contain the modules and their lateral dimensions, it is not possible to locate equipment for forming any riveted joint other than a blind riveted joint.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during the prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. A method of joining a plurality of sheets by means of a blind rivet, which comprises:

(i) forming holes in the sheets and placing the sheets together so that the holes are in register and form a single hole therethrough;

(ii) inserting a blind rivet into the hole formed in the sheets from a working side thereof, the blind rivet comprising a sleeve positioned about a mandrel that has a head; and (iii) setting the rivet;

wherein the hole is radially enlarged at the outwardly facing surface of at least the sheet on the blind side, and the sleeve of the rivet is deformed during setting to form a rivet joint in which no part of the rivet is proud of the outwardly facing surface of the sheet at least on the blind side of the sheets.

2. A method as claimed in claim 1, wherein the hole is radially enlarged at the outwardly facing surfaces of both sheets and after setting of the rivet, no part of the rivet is proud of the outwardly facing surface of either sheet.

3. A method as claimed in claim 2, wherein the rivet sleeve is shaped to engage the radial enlargement on the working side of the hole.

4. A method as claimed in claim 3, wherein the rivet sleeve has a substantially frusto-conical part that engages the radial enlargement on the working side of the hole when the rivet is inserted in the hole.

5. A method as claimed in claim 4, wherein the frusto-conical part of the sleeve has a flat end surface that is substantially flush with the surface of the sheet on the working side thereof.

6. A method as claimed in claim 2, wherein the rivet sleeve is substantially cylindrical and is deformed into the countersink on the working side of the sheets during setting thereof.

7. A method as claimed in claim 6, wherein, during setting of the rivet, a setting tool jaw applies force on the rivet sleeve along the axis of the mandrel to deform the sleeve into the countersink.

8. A method as claimed in claim 1, wherein the mandrel has a region at the base of the head that slopes with respect to the axis of the mandrel so that, during setting of the rivet, part of the sleeve is deformed radially outwardly into the countersink on the blind side of the sheets.

9. A method as claimed in claim 8, wherein the mandrel head has a generally flat upper surface and remains in the rivet sleeve in the rivet joint.

10. A method as claimed in claim 1, wherein the mandrel head has a generally flat lower portion which causes the rivet sleeve to deform axially during setting of the rivet.

11. A method as claimed in claim 1, wherein the mandrel is removed from the rivet joint after setting.

* * * * *